United States Patent
Wu et al.

(10) Patent No.: US 8,368,110 B2
(45) Date of Patent: Feb. 5, 2013

(54) SIDE VIEW LED PACKAGE STRUCTURE

(75) Inventors: Yi-Tsuo Wu, Jhonghe (TW);
Chung-Chuan Hsieh, Panchiao (TW);
Chia-Hsien Chang, Yongjing Township, Changhua County (TW)

(73) Assignee: Everlight Electronics Co., Ltd. (TW)

( * ) Notice: Subject to any disclaimer, the term of this patent is extended or adjusted under 35 U.S.C. 154(b) by 775 days.

(21) Appl. No.: 11/902,141

(22) Filed: Sep. 19, 2007

(65) Prior Publication Data

US 2008/0067535 A1 Mar. 20, 2008

(30) Foreign Application Priority Data

Sep. 19, 2006 (TW) .............................. 95216726 U

(51) Int. Cl.
*H01L 33/00* (2010.01)
*H01L 21/02* (2006.01)

(52) U.S. Cl. ............ 257/99; 257/81; 257/100; 257/433; 257/434; 257/675; 257/676; 257/706; 257/707; 257/E33.055; 257/E33.056; 257/E33.057; 257/E33.058; 257/E33.059

(58) Field of Classification Search .................. 257/675, 257/676, 706, 796, 99, 100, E33.055–E33.059; 362/294, 373
See application file for complete search history.

(56) References Cited

U.S. PATENT DOCUMENTS

| | | | | |
|---|---|---|---|---|
| 6,480,389 B1 * | 11/2002 | Shie et al. | ...................... | 361/707 |
| 6,540,377 B1 * | 4/2003 | Ota et al. | ...................... | 362/231 |
| 6,799,870 B2 * | 10/2004 | Lin | ............................... | 362/294 |
| 6,943,433 B2 * | 9/2005 | Kamada | ........................ | 257/666 |
| 7,168,842 B2 * | 1/2007 | Chou et al. | .................... | 362/631 |
| 7,566,159 B2 * | 7/2009 | Oon et al. | ..................... | 362/612 |
| 7,615,799 B2 * | 11/2009 | Su | ................................... | 257/99 |
| 2004/0135156 A1 * | 7/2004 | Takenaka | ........................ | 257/79 |

* cited by examiner

*Primary Examiner* — S. V. Clark
*Assistant Examiner* — Jesse Y Miyoshi
(74) *Attorney, Agent, or Firm* — Andy M. Han; Han IP Law PLLC

(57) ABSTRACT

A side view light emitting diode (LED) package structure includes a package housing, a side view LED chip and a thermal conductive member. The side view LED chip is enclosed by the package housing and an emitting direction of the side view LED chip is perpendicular to a thickness direction of a substrate. The thermal conductive member connected with the side view LED chip is disposed inside the package housing and a portion of which extends out of a dissipation opening of the package housing to be exposed so that heat of the side view LED chip is dissipated.

20 Claims, 2 Drawing Sheets

SIDE VIEW LED PACKAGE STRUCTURE

RELATED APPLICATIONS

This application claims priority to Taiwan Application Serial Number 95216726, filed Sep. 19, 2006, which is herein incorporated by reference.

FIELD OF THE INVENTION

The present invention generally relates to a light emitting diode package structure. More particularly, this invention relates to a side view light emitting diode package structure with an improved heat dissipation capability.

BACKGROUND OF THE INVENTION

Semiconductor light emitting diode (LED) has become a promising device for general-purpose illumination applications. LED features include, excellent durability, long operation life, low power consumption, no mercury content and potentially high efficiency. White LED is an illumination light source that is good for environmental protection and energy saving. Recently, LEDs are progressively being used in the illumination field for electronic devices. For example, LEDs are popularly used in the electric torch and vehicle headlights.

The LED can be classified into a top view LED and a side view LED according to the emitting direction of the LED chip on the substrate thereof. However, the heat dissipation problem of the side view LED is more serious while the side view LED is designed with a high power output. An increase in the LED chip current can cause the heat generated by the LED chip increase since the illumination of the LED is proportional to the current passing through the LED chip.

Accordingly, there is a need to dissipate the heat generated by the side view LED with the higher power output.

SUMMARY OF THE INVENTION

One object of the present invention is to provide a side view light emitting diode (LED) package structure to improve the heat dissipation capacity for a high power side view LED.

Another object of the present invention is to provide a side view light emitting diode (LED) package structure to extend the life span of the LED.

To achieve these and other advantages and in accordance with the purpose of the present invention, as the embodiment broadly describes herein, the present invention provides a side view light emitting diode (LED) package structure. The side view LED package structure includes a package housing, a side view LED chip and a thermal conductive member. The package housing includes an emission opening and a dissipation opening. The side view LED chip is disposed inside the package housing. Additionally, an emitting direction of the side view LED chip is perpendicular to a thickness direction of a substrate and toward the emitting opening.

The thermal conductive member is connected to the side view LED chip and a part of the thermal conductive member is exposed out of the package housing through the dissipation opening to dissipate a heat generated by the side view LED chip.

In a preferred embodiment, the side view LED package structure further includes a set of electrode leads to respectively electrically connect a positive electrode and a negative electrode of the side view LED chip to supply external power into the side view LED chip. The electrode leads are electrically connected to the side view LED chip through respective conducting wires using a wire bond process.

The thermal conductive member connected to the side view LED chip can transmit the heat generated by the side view LED chip to dissipate the heat into the environment and the residual heat can be further transmitted to the substrate to be further dissipated so as to provide dual heat dissipation paths for the LED chip.

Accordingly, the side view LED package structure according to the present invention can effectively prevent a high power side view LED from damage caused by a high working temperature, and further extend the life span of the side view LED.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1A:
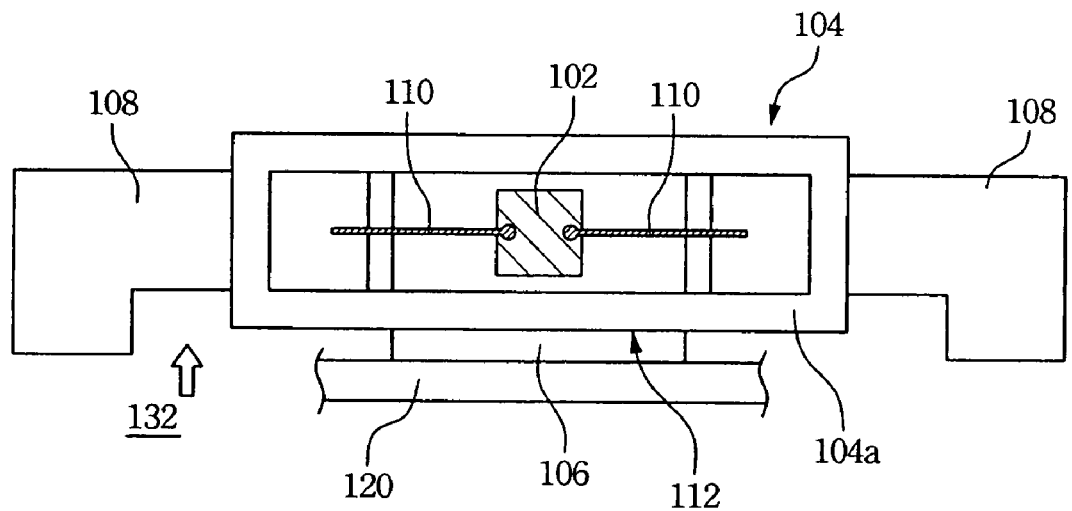
FIG. 1A illustrates a front view of a preferred embodiment of the side view light emitting diode (LED) package structure according to the present invention.
Figure 1B:
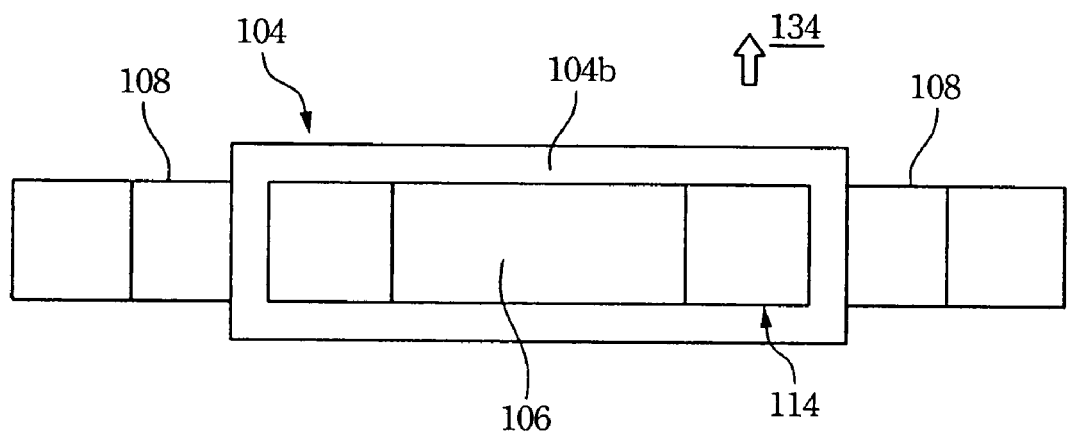
FIG. 1B illustrates a bottom view of the preferred embodiment of the light emitting diode package structure of FIG. 1A.

Refer to FIG. 1A and FIG. 1B, FIG. 1A is a front view and FIG. 1B is a bottom view of a preferred embodiment of the side view light emitting diode (LED) package structure according to the present invention are respectively illustrated. The side view light emitting diode (LED) package structure according to the present invention includes a package housing 104, a side view LED chip 102 and a thermal conductive member 106.

The side view LED chip 102 is disposed inside the package housing 104 and enclosed by the package housing 104 to protect the side view LED chip 102. In addition, the package housing 104 includes an emitting opening 112 from where the light generated by the LED chip 102 is emitted directly in the emitting direction 134 of the LED chip 102. Since the LED chip 102 is a side view LED chip, the emitting direction 134 thereof is perpendicular to the thickness direction 132 of the substrate 120 on which the LED is fixed.

The thermal conductive member 106 is connected to the LED chip 102, and the thermal conductive member 106 and the LED chip 102 are packaged by the package housing 104. A part of the thermal conductive member 106 is exposed out of the package housing 104 through a dissipation opening 114 to couple to the substrate 120. Alternatively, the part of the thermal conductive member 106 is first connected to an additional thermal conductive member and the additional thermal conductive member is then connected to the substrate 120 without departing from the scope and spirit of the present invention. The heat generated by the LED chip 102 can conduct to the thermal conductive member 106 to dissipate the heat and the thermal conductive member 106 can also conduct the residual heat to the substrate 120 to further dissipate the heat.

In one preferred embodiment, the side view LED package structure includes a side view LED chip 102, a thermal conductive member 106 connected to the LED chip 102, a set of electrode leads 108 respectively connected to the positive electrode and the negative electrode of the side view LED chip 102 to supply the power to the side view LED chip 102. When manufacturing the LED, the conducting wire 110 electrically connects the side view LED chip 102 to the electrode lead 108 in the wire bonding process. The package housing 104 holds the side view LED chip 102 and the thermal conductive member 106 to protect the side view LED chip 102 and further reflect the light generated by the side view LED chip 102 to improve the luminous efficiency of the LED.

A part of the thermal conductive member 106 is exposed out of the package housing 104 through a dissipation opening 114. In one preferred embodiment, the dissipation opening 114 is disposed on a second surface 104b perpendicular to a first surface 104a on which the emitting opening 112 is disposed. To prevent the light leakage of the LED through the dissipation opening 114, the thermal conductive member 106 preferably occupies the whole dissipation opening 114.

The package housing can be formed by the injection molding process to enclose the LED chip and the material thereof can be a high reflectivity material, for example, a metal material, a nonmetal material, a macromolecule material or a combination thereof with high reflectivity. The material of the conducting wire can be selected from the group of gold, silver, aluminum and alloy. In addition, the material of the electrode lead can be selected from the group of silver, silver alloy, copper, copper alloy, aluminum, aluminum alloy and a metal material coated with gold or silver.

With the side view LED package structure, the heat generated by the LED chip 102 can transmit to the thermal conductive member 106 connected to the LED chip 102. In addition, at least a part of the heat can be directly dissipated into the environment through the thermal conductive member 106 and the residual heat can be further transmitted to the substrate 120 to be dissipated. Therefore, the temperature of the LED chip 102 can be reduced through the thermal conductive member 106 and the substrate 120 to effectively prevent a high working temperature for a high power LED chip so as to prevent damage to the LED chip 102.

Figure 2:
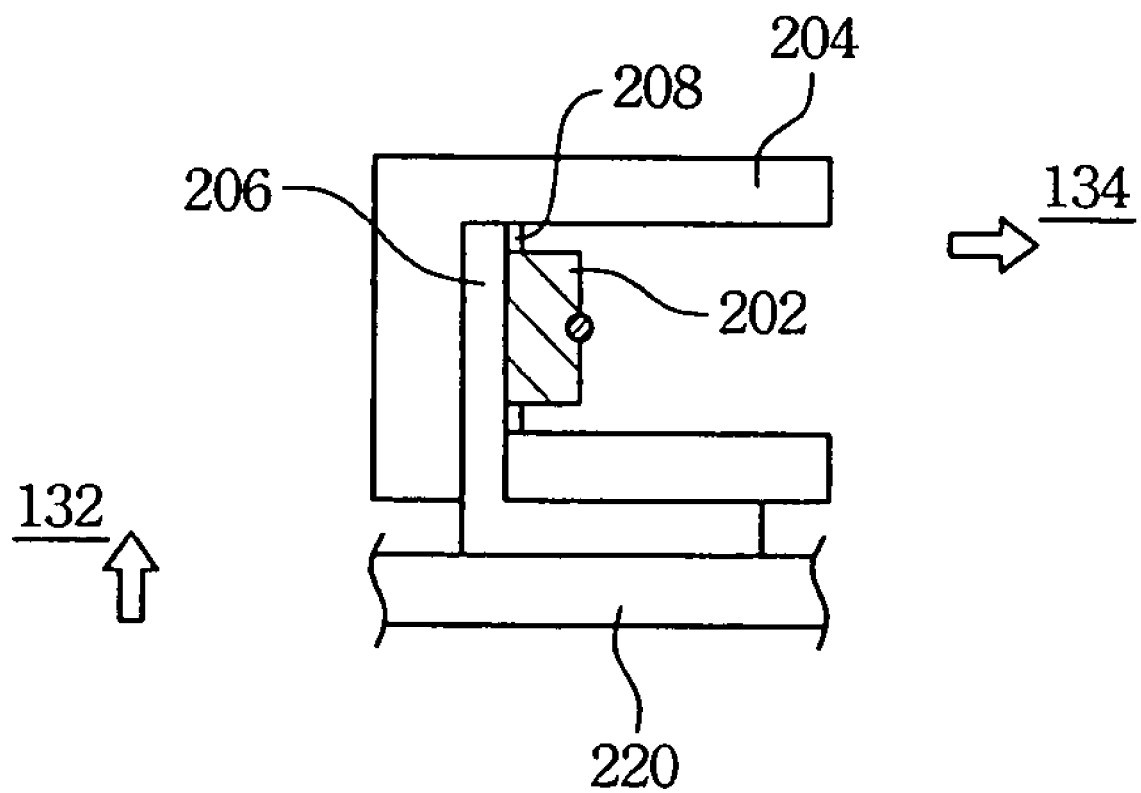
FIG. 2 illustrates a cross-sectional view of another preferred embodiment of the light emitting diode package structure according to the present invention.

Referring to FIG. 2, a cross-sectional view of another preferred embodiment of the light emitting diode package structure according to the present invention is illustrated. The thermal conductive member can be modified according to the requirement of the LED product. In the preferred embodiment, the thermal conductive member 206 is formed by an L-shaped conductive material. Alternatively, a thermal conductive member 206 is connected with another heat conductive member to form an L-shaped thermal conductive member. The L-shaped thermal conductive member is further connected to the substrate 220. Therefore, the L-shaped thermal conductive member can be effectively connected to the side view LED chip 202 disposed in the package housing 204 and the substrate 220. The thermal conductive member 206 is preferably formed by a material with a thermal conductivity of 10 W/mK or above.

Additionally, the thermal conductive member 206 can be further coated with a high reflectivity layer 208, such as gold or silver, to provide a better reflective path in the package housing 204 so as to improve the reflectivity efficiency for the LED.

Accordingly, the side view LED package structure according to the present invention can effectively prevent the high power side view LED from damage, extend the life span of the side view LED, and further improve the reflectivity efficiency for the side view LED.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A side view light emitting diode (LED) package structure for mounting on a substrate, the side view LED package structure comprising:
   a package housing with an emitting opening and a dissipation opening;
   an LED chip disposed inside the package housing such that the LED chip is oriented to emit light out of the package housing via the emitting opening;
   two electrode leads electrically connected to a positive electrode and a negative electrode of the LED chip, respectively, such that an external power is supplied to the LED chip via the two electrode leads; and
   a thermal conductive member not the same as either of the two electrode leads and having a first part and a second part connected to the first part, the first part penetrating through the dissipation opening and the second part being disposed outside the package housing, wherein:
   the LED chip is disposed on and thermally connected to a first surface of the first part of the thermal conductive member,
   the first surface of the first part of the thermal conductive member is perpendicular to a first surface of the substrate,
   the side view LED package structure is mounted on the first surface of the substrate,
   an upper surface of the LED chip is perpendicular to the first surface of the substrate,
   the second part of the thermal conductive member is thermally connected to the substrate, and
   the second part of the thermal conductive member extends towards the emitting opening along a direction parallel to the first surface of the substrate.

2. The side view LED package structure of claim 1, wherein the first part and the second part of the thermal conductive member are integrally formed into an L-shaped thermal conductive member.

3. The side view LED package structure of claim 1, wherein a thermal conductivity of the thermal conductive member is 10 W/mK or greater.

4. The side view LED package structure of claim 1, wherein the first part of the thermal conductive member occupies the dissipation opening.

5. The side view LED package structure of claim 1, wherein a first surface of the first part of the thermal conductive member on which the LED chip is disposed is coated with a high reflectivity layer.

6. The side view LED package structure of claim 5, wherein the high reflectivity layer is made of gold or silver.

7. The side view LED package structure of claim 1, wherein the package housing is made of a high reflectivity material.

8. The side view LED package structure of claim 1, wherein the two electrode leads are fixed on the package housing and electrically insulated from the thermal conductive member.

9. The side view LED package structure of claim 8, wherein the two electrode leads are electrically connected to the LED chip through respective conducting wires.

10. A light emitting diode (LED) package structure, comprising:
   a thermal conductive member having a first part and a second part coupled to the first part, the second part configured to be thermally connected to a first surface of a substrate to mount the LED package structure on the substrate, wherein a first surface of the first part is perpendicular to the first surface of the substrate when the LED package structure is mounted on the first surface of the substrate;
   an LED chip disposed on and thermally connected to the first surface of the first part of the thermal conductive member such that an upper surface of the LED chip is perpendicular to the first surface of the substrate
   two electrode leads electrically connected to a positive electrode and a negative electrode of the LED chip, respectively, such that an external power is supplied to the LED chip via the two electrode leads, each of the two electrode leads not the same as the thermal conductive member; and
   a housing enclosing the LED chip and the first part of the thermal conductive member and exposing the second part of the thermal conductive member.

11. The LED package structure of claim 10, wherein the first part and the second part are integrally formed into an L-shaped thermal conductive member.

12. The LED package structure of claim 10, wherein at the thermal conductive member has a thermal conductivity of 10 W/mK or greater.

13. The LED package structure of claim 10, wherein the two electrode leads are fixed on the housing and electrically insulated from the thermal conductive member.

14. The LED package structure of claim 10, wherein the first surface of the first part of the thermal conductive member is coated with a high reflectivity layer.

15. A light emitting diode (LED) package structure for mounting on a substrate, the LED package structure comprising:
   a housing having an emitting opening and a dissipation opening;
   an L-shaped thermal conductive member having a vertical part and a horizontal part such that a first portion of the vertical part is disposed in the housing and a second portion of the vertical part penetrates outside the housing through the dissipation opening, wherein the horizontal part is in contact with a first surface of the substrate, and wherein a first surface of the vertical part is perpendicular to the first surface of the substrate when the L-shaped thermal conductive member is mounted on the substrate;
   an LED chip disposed on and thermally connected to the first surface of the vertical part of the L-shaped thermal conductive member and disposed inside the housing in an orientation such that an upper surface of the LED chip is perpendicular to the first surface of the substrate; and
   two electrode leads electrically connected to a positive electrode and a negative electrode of the LED chip, respectively, such that an external power is supplied to the LED chip via the two electrode leads, each of the two electrode leads not the same as the L-shaped thermal conductive member.

16. The LED package structure of claim 15, wherein a thermal conductivity of the L-shaped thermal conductive member is 10 W/mK or greater.

17. The LED package structure of claim 15, wherein a first surface of the vertical part on which the LED chip is disposed is coated with a high reflectivity layer.

18. The LED package structure of claim 15, wherein the housing is made of a high reflectivity material.

19. The LED package structure of claim 15, wherein the two electrode leads are fixed on the housing and electrically insulated from the thermal conductive member.

20. The LED package structure of claim 19, wherein the two electrode leads are electrically connected to the LED chip through respective conducting wires.

* * * * *